(12) United States Patent
Park

(10) Patent No.: US 7,808,825 B2
(45) Date of Patent: Oct. 5, 2010

(54) NON-VOLATILE MEMORY DEVICE AND METHOD OF PROGRAMMING THE SAME

(75) Inventor: Won Sun Park, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 125 days.

(21) Appl. No.: 12/163,866

(22) Filed: Jun. 27, 2008

(65) Prior Publication Data

US 2009/0161435 A1   Jun. 25, 2009

(30) Foreign Application Priority Data

Dec. 24, 2007   (KR) ...................... 10-2007-0136301

(51) Int. Cl.
  *G11C 16/04*   (2006.01)
(52) U.S. Cl. ............................ 365/185.12; 365/185.05; 711/169; 711/103; 711/154
(58) Field of Classification Search .................. None
See application file for complete search history.

(56) References Cited

U.S. PATENT DOCUMENTS

2005/0172086 A1* 8/2005 Kawai ........................ 711/154
2006/0136687 A1* 6/2006 Conley et al. ............... 711/162
2007/0061538 A1* 3/2007 Chang et al. ................ 711/169

FOREIGN PATENT DOCUMENTS

KR    1020020092261 A    12/2002

* cited by examiner

*Primary Examiner*—Hoai V Ho
*Assistant Examiner*—James G Norman
(74) *Attorney, Agent, or Firm*—Townsend and Townsend and Crew LLP

(57) ABSTRACT

When performing a program operation, a non-volatile memory device comprising a multi-plane performs a cache write operation by employing a page buffer circuit of a plane that does not perform the program operation. A data line mux transfers an externally input first data to a page buffer unit of a plane, which will be programmed, according to a plane select signal, transfers a second data to a page buffer unit of a plane on which a program operation is not performed, while the program of the selected plane is performed, and after the first data is programmed, provides a data transfer path between one page buffer unit and the other page buffer unit according to a data transfer control signal.

10 Claims, 3 Drawing Sheets

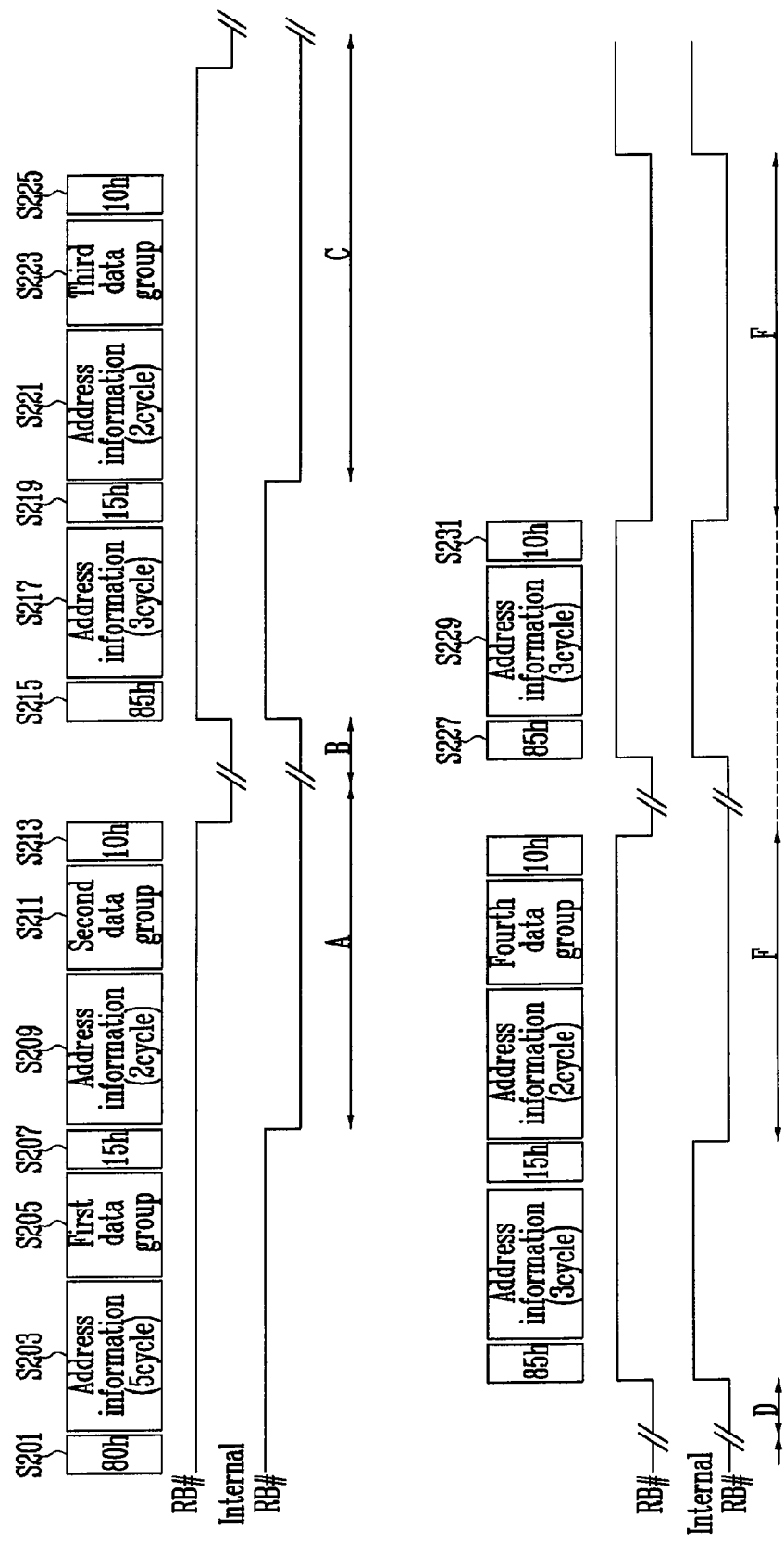

NON-VOLATILE MEMORY DEVICE AND METHOD OF PROGRAMMING THE SAME

CROSS-REFERENCE TO RELATED APPLICATION

The present application claims priority to Korean patent application number 10-2007-0136301, filed on Dec. 24, 2007, which is incorporated by reference in its entirety.

BACKGROUND OF THE INVENTION

The present invention relates to a data program operation of a non-volatile memory device and, more particularly, to a non-volatile memory device consisting of a multi-plane and a method of programming the same.

A flash memory device, that is, a non-volatile memory device, can be classified into a single plane type and a multi-plane type depending on the structure of a memory cell array. The single plane type memory device includes only one plane comprising a plurality of memory cell blocks and the multi-plane type memory device includes a plurality of planes respectively comprising a plurality of memory cell blocks.

The flash memory device performs a program operation by employing a write command, address information, and data to be stored, which are received from a data I/O pad connected to the outside, in order to store data in a memory cell.

In the program operation of the flash memory device, a program command code $80h$ is input through the I/O pad, address information of 5 cycles is input, program data is input, and an execution code $10H$ is finally input.

According to the program command code, the flash memory device checks an input address, selects a page buffer, and temporarily stores the input program data in a latch circuit of the page buffer. Further, according to the execution code, the flash memory device programs the data that is temporarily stored in the page buffer into a memory cell selected based on the input address.

The time required for the program operation of the flash memory device to be executed can be calculated by the following Equation.

$$T = (K \times tWC + tPROG) \times N \qquad \text{[Equation 1]}$$

In Equation 1, T denotes a total program time, K denotes the number of page buffers, tWC denotes the time of IO writing per byte, and tPROG denotes the time required to program data into a cell. N denotes the number of times that a write operation is repeated. In Equation 1, a program command time and an address input time are omitted from the total program time T.

From Equation 1, it can be seen that in the program operation of a flash memory device, the time tWC where data is input has a great influence on the program operation time. One of the methods for minimizing the data input time is a method employing a cache write method.

The cache write method refers to a method of receiving next program data while programming data into a memory cell, and storing the received next data in one of several latch circuits included in a page buffer. If this method is used, the total program time can be shortened as follows.

$$T = K \times tWC + tPROG \qquad \text{[Equation 2]}$$

In order to use the cache write method when performing a program operation, a latch circuit, which is not influenced by the program operation, must be added to the page buffer. However, a multi-level cell memory device requires a large number of latch circuits included in a page buffer as the level of cell memory is increased. However, if the latch circuits for cache writing are added, it poses problems in minimizing the area of the page buffer circuit and the area of a memory chip and also results in a complicated algorithm.

BRIEF SUMMARY OF THE INVENTION

The present invention is directed towards a non-volatile memory device and a method of programming the same, in which, when performing a program operation, a non-volatile memory device comprising a multi-plane performs a cache write operation by employing a page buffer circuit of a plane that does not perform the program operation.

A non-volatile memory device according to an aspect of the present invention includes two or more planes, page buffer units respectively connected to the planes, a data line mux, and a controller. The data line mux transfers an externally input first data to a page buffer unit of a plane, which will be programmed, according to a plane select signal; transfers a second data to a page buffer unit of a plane on which a program operation is not performed, while the program of the selected plane is performed; and after the first data is programmed, provides a data transfer path between one page buffer unit and another page buffer unit according to a data transfer control signal. The controller selects a plane on which a program operation will be performed based on externally input address information, stores the second data in the page buffer unit of the unselected plane according to a plane cache write command, and provides a plane cache transmission signal for transferring the stored second data to the page buffer of the selected plane on which the program operation is performed.

The controller includes a counter for counting an address where the first data will be programmed, based on the externally input address information, and for storing start and end column address information of the second data.

The data line mux includes a demux for providing a path through which externally input data is transferred to a page buffer unit of a plane selected according to the plane select signal of the controller, and a data transfer unit for providing the data transmission path between one page buffer unit and another page buffer unit according to the data transfer control signal of the controller.

The demux selects one of the page buffer units according to the plane select signal and the plane cache transmission signal provided from the controller, and transmits the externally input data to a selected page buffer unit.

The demux transmits the first data to a page buffer unit of a plane selected in order to program the first data according to the plane select signal, and transmits the second data to a page buffer unit of a plane on which the program operation is not performed according to the plane select signal and the plane cache transmission signal.

The data transfer unit comprises one or more switching elements for providing, in one direction, the data transmission path between page buffer units according to the data transfer control signal of the controller.

Assuming that the page buffer units include a first page buffer unit and a second page buffer unit, the data transfer unit includes a first switching element for providing a data transfer path from the first page buffer unit to the second page buffer unit, and a second switching element for providing a data transfer path from the second page buffer unit to the first page buffer unit. The first and second switching elements are operated in response to the data transfer control signal of the controller.

The controller includes a cache transmission controller for outputting the data transfer control signal by employing plane address information, included in the input address, and the plane cache transmission signal; and a plane select unit for outputting the plane select signal according to the plane address information and the plane cache write command.

When the plane write command is input, the plane select unit generates the plane select signal so that a plane on which a program operation has not been performed is selected.

A non-volatile memory device according to another aspect of the present invention includes two or more planes, a page buffer provided in each plane, and a latch for temporarily storing data to be programmed when one plane is programmed. The latch is included in a page buffer of the plane that is not being programmed.

A method of programming a non-volatile memory device including a plurality of planes according to still another aspect of the present invention includes latching a program command and an input first data in a first page buffer unit of a selected first plane and performing a program operation, while the program operation is performed; latching a plane cache write command and an input second data in a second page buffer unit of an unselected second plane; after the first data is programmed, transmitting the second data, latched in the second page buffer unit, to the first page buffer unit according to a data transfer control signal; and programming the second data, stored in a page buffer unit of a selected plane, according to address information input together with a consecutive program command.

Column address information and row address information are input together with the first data, so that the first plane is selected.

Column address information is input together with the second data, and row address information is input together with the consecutive program command.

When latching the second data in the second page buffer unit of the unselected second plane according to the plane cache write command, address counting is performed using a column address, input together with the second data, as a start address and last address information is stored.

The method further includes, while the second data is programmed, latching a third data, input together with the plane cache write command, in a page buffer of a plane on which a program operation is not performed; after the second data is programmed, transferring the third data stored in the page buffer unit to the page buffer unit on which the program of the second data has been performed, according to the data transfer control signal; and programming the third data stored in a page buffer unit of a plane selected according to address information input together with a consecutive program command.

BRIEF DESCRIPTION OF THE DRAWINGS

FIG. 2 is a timing diagram of a program operation in accordance with an embodiment of the present invention.

DESCRIPTION OF SPECIFIC EMBODIMENTS

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the present invention. The present invention is defined by the scope of the claims.

Figure 1A:
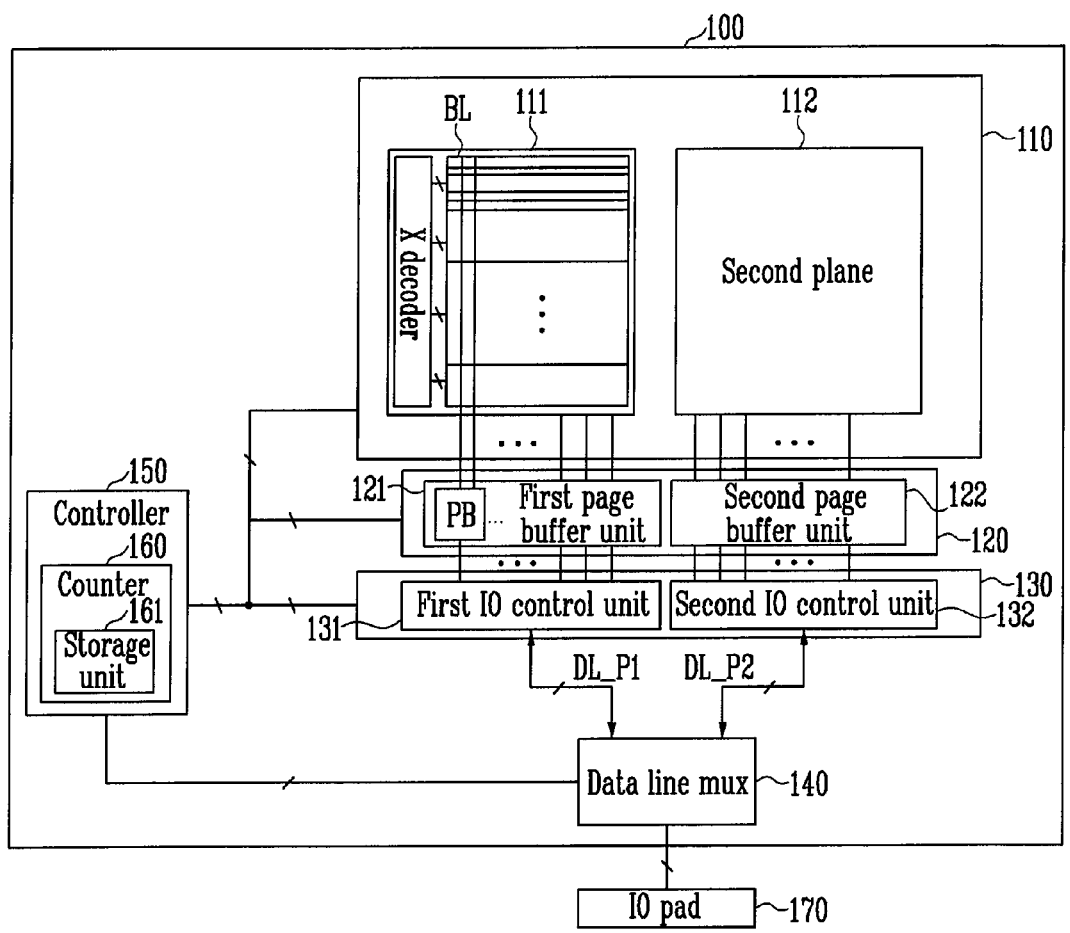
FIG. 1A is a block diagram of a NAND flash memory device in accordance with an embodiment the present invention.

FIG. 1A is a block diagram of a NAND flash memory device in accordance with an embodiment of the present invention.

Referring to FIG. 1A, a NAND flash memory device 100 in accordance with an embodiment of the present invention includes a plane unit 110, a page buffer unit 120, an IO control unit 130, a data line mux 140, and a controller 150.

The plane unit 110 includes first and second planes 111 and 112. Each of the planes 111 and 112 includes a memory cell array having a plurality of memory blocks BLK. Each memory block includes a plurality of memory cells connected by word lines WL and bit lines BL. Each plane further includes an X decoder for selecting the memory block BLK and the word line WL according to an input address.

The page buffer unit 120 includes a first page buffer unit 121 connected to the first plane 111, and a second page buffer unit 122 connected to the second plane 112. The page buffer unit 120 includes a plurality of page buffer circuits PB respectively connected to bit line pairs of the memory cell array of the plane unit 110 and adapted to perform data program and read operations.

The IO control unit 130 includes a first IO control unit 131 for controlling input and output data of the first page buffer unit 121 and a second IO control unit 132 for controlling input and output data of the second page buffer unit 122.

The data line mux 140 connects a data line selected according to a plane select signal, of data lines DL_P1, DL_P2 respectively connected to the first IO control unit 131 and the second IO control unit 132, to an external IO pad 170.

The data line mux 140 transfers commands, address information, etc., which are input from the IO pad 170, to the controller 150. Further, the data line mux 140 provides a path through which data, stored in a page buffer of an unselected plane, is transferred to a page buffer of a selected plane, under the control of the controller 150.

The controller 150 outputs control signals for selecting a plane on which an operation will be performed according to an input address and a page buffer. The controller 150 also provides the data line mux 140 with a plane select signal PS for a plane write operation and cache transmission control signals P1 to P2 or P2 to P1.

The controller 150 includes a counter 160 for performing address counting for a program operation and for storing address information for a plane cache operation.

The counter 160 includes a storage unit 161. The storage unit 161 sequentially outputs address counting signals using an input address as a start address, and stores start and last column addresses of data stored in a page buffer of an unselected plane for a plane cache operation.

The data line mux 140 is constructed as follows.

Figure 1B:
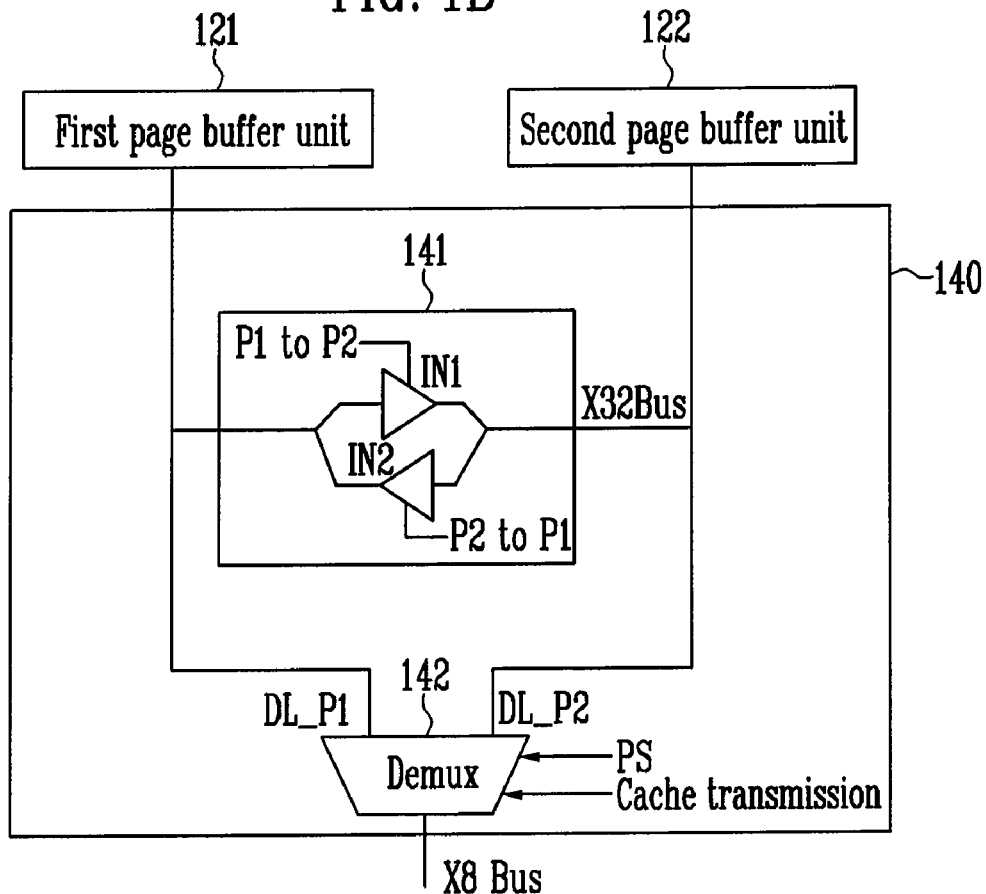
FIG. 1B is a detailed circuit diagram of a data line mux shown in FIG. 1A.

FIG. 1B is a detailed circuit diagram of the data line mux shown in FIG. 1A.

Referring to FIG. 1B, the data line mux 140 includes a data transfer unit 141 and a demux 142.

The data transfer unit 141 transfers data, latched in the first page buffer unit 121, to the second page buffer unit 122 or transfers data, latched in the second page buffer unit 122, to the first page buffer unit 121 in response to the control signals.

The demux 142 selectively transfers data input from the IO pad 170 to the first page buffer unit 121 or to the second page buffer unit 122 according to the plane select signal PS and the cache transmission signal. The data input from the IO pad unit 170 is 8 bits.

The data transfer unit 141 includes first and second inverters IN1, IN2. The first and second inverters IN1, IN2 comprise a three-phase inverter and output data according to the control signals. The first inverter IN1 provides a path through which data latched in the first page buffer unit 121 is transmitted to the second page buffer unit 122 in response to the control signals P1 to P2. The second inverter IN2 provides a path through which data latched in the second page buffer unit 122 is transmitted to the first page buffer unit 121 in response to the control signals P2 to P1.

The control signals P1 to P2, P2 to P1 are generated from the controller 150. The controller 150 that generates the control signals P1 to P2, P2 to P1, the plane select signal PS, a cache transmission signal, etc. is described below.

Figure 1C:
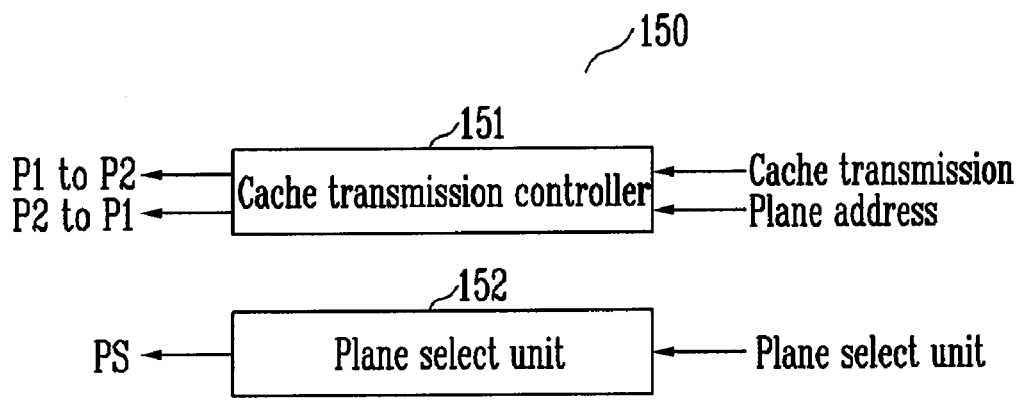
FIG. 1C is a block diagram of a controller shown in FIG. 1A.

FIG. 1C is a block diagram of the controller shown in FIG. 1A.

Referring to FIG. 1C, the controller 150 of the flash memory device in accordance with an embodiment of the present invention includes a cache transmission controller 151 and a plane select unit 152.

When the plane cache operation is performed, the cache transmission controller 151 generates the control signals P1 to P2, P2 to P1 by employing a cache transmission control signal and plane address information. The control signals P1 to P2, P2 to P1 are used to transfer data, stored in a page buffer circuit of an unselected plane, to a page buffer circuit of a selected plane, after the data stored in the page buffer circuit of the selected plane is programmed.

When a command pertinent to a plane cache write operation is input, the plane select unit 152 outputs a plane select signal so that the demux 142 transfers data, input from the IO pad 170, to the first page buffer unit 121 or the second page buffer unit 122.

The control signals P1 to P2 are used to transfer data, latched in the first page buffer unit 121, to the second page buffer unit 122. The control signals P2 to P1 are used to transfer data, latched in the second page buffer unit 122, to the first page buffer unit 121.

The plane select unit 152 outputs a signal for selecting the first plane 111 or the second plane 112 according to the plane change signal. In an embodiment of the present invention, when the plane select signal PS is a high level, the first plane 111 is selected and when the plane select signal PS is a low level, the second plane 112 is selected.

In the case in which a flash memory device includes two or more planes, a method using one or more plane select signals, a method of selecting a plane by transferring data or the like may be used.

A program operation of the flash memory device constructed as described above with reference to FIGS. 1A to 1C according to an embodiment of the present invention is performed as follows.

FIG. 2 is a timing diagram of a program operation in accordance with an embodiment of the present invention.

In the program operation according to an embodiment of the present invention, it is assumed that data to be programmed corresponds to the amount of data which will be programmed into four pages on the basis of a page unit of one plane, and a plane on which program will be performed is a first plane 111. Data to be stored in the four pages are referred to as first to fourth data groups, respectively.

Referring to FIG. 2, in order to start a program operation, a program command, address information and data to be programmed are input through the IO pad 170. That is, the program command 80h is input at step S201 and the address information is input at step S203. A first data group to be programmed into the first page is input at step S205.

An internal ready busy signal Internal RB# and an external ready busy signal RB# are at a high level.

The address information is generally input as 5 cycles. Of the 5 cycles, column address information is comprised of 2 cycles and row address information is comprised of 3 cycles. The column address information is used to select the page buffer circuit PB of the page buffer unit and the row address information includes an address of a page to be programmed, an address BLK of a memory block and a plane address. In the flash memory device 100, a page has the same meaning as a word line.

At step S203, the address information of 5 cycles is input.

The flash memory device 100 processes the data that is input to the IO pad 170 at steps S201 to S203 as follows.

The data line mux 140 transfers the program command 80h and the address information, input through the IO pad 170, to the controller 150. The controller 150 outputs the control signals for the program operation according to the program command 80h and checks a plane on which a program operation will be performed based on the address information. Further, the plane select unit 152 generates the plane select signal PS and inputs the signal to the data line mux 140.

The demux 142 of the data line mux 140 transfers data to be programmed, which is input from the IO pad 170, to a page buffer unit of a selected plane in response to the plane select signal PS.

In an embodiment of the present invention, a program operation is performed on the first plane. Thus, the plane select unit 152 generates the plane select signal PS at a high level and transfers the generated signal to the data line mux 140.

The demux 142 of the data line mux 140 transfers the first data group to the first page buffer unit 121 in response to the plane select signal PS of a high level.

The first page buffer unit 121 sequentially latches the first data group, received from the demux 142, in the page buffer circuit. The first data group is data to be programmed into one page as described above. For example, when one page of the first plane has 4K bytes, the first data group is data of 4K bytes. After the first data group is latched in the first page buffer unit 121, the controller 150 changes the internal ready busy signal Internal RB# to a low level so that data program is performed on the first plane 111. Although the internal ready busy signal Internal RB# is changed to a low level so that the program operation is performed, the external ready busy signal RB# remains at a high level so that data can be input from the IO pad 170.

Thus, in order to input the second data group, a plane cache command 15h is input at step S207 and address information is input at step S209. Next, the second data group to be programmed is input at step S211 and an execution command 10h is input at step S213.

The data line mux 140 transfers the plane cache command 15h and the address information, input at steps S207 and S209, to the controller 150. The controller 150 inputs the plane change signal to the plane select unit 152 according to the plane cache command 15h so that the plane select signal PS shifts from a high level to a low level. Accordingly, the demux 142 transfers the second data group, input at step S211, to the second page buffer unit 122 of the second plane 112.

The address information input at step S209 includes column address information. Thus, the counter 160 of the controller 150 stores the column address in the storage unit 161 and then performs sequential address counting beginning with the column address. The data of step S211 is sequentially latched in the second page buffer unit 122 according to the address counting signal.

After the data of step S211 is latched in the second page buffer unit 122, column address information that is counted is stored in the storage unit 161. Therefore, the storage unit 161 stores both the start and end column address information of the data stored in the second page buffer unit 122. The storage unit 161 consists of a plurality of registers and can store respective pieces of column address information.

When the execution command 10h is input, the external ready busy signal RB# shifts to a low level and cannot receive any further data.

As shown in FIG. 2, the section A where the first data group is programmed is followed by a plane cache data transfer section B where the controller 150 transfers the cache transmission command and the plane address information to the cache transmission controller 151.

Therefore, after the first data group is completely programmed, the controller 150 outputs the cache transmission command. In response thereto, the cache transmission controller 151 checks a current plane address and outputs the control signals. Since the program operation has been performed on the first plane 111, the cache transmission controller 151 outputs the control signals P2 to P1. In other words, the second data group to be programmed next has been stored in the second page buffer unit 122 of the second plane 112 while the program operation is being performed on the first plane 111. Accordingly, the cache transmission controller 151 outputs the control signals P2 to P1, instructing that the data stored in the second page buffer unit 122 be transferred to the first page buffer unit 121.

The second inverter IN2 of the data transfer unit 141 is enabled in response to the control signals P2 to P1. The controller 150 outputs control signals, instructing that the data of the second page buffer unit 122 be transferred to the first page buffer unit 121. The control signals are similar to the control signals in the operation where the first page buffer unit 121 latches input data except that the input data is transferred not from the IO pad 170 but from the second page buffer unit 122. After the data is fully transferred, the same data is latched in the first page buffer unit 121 and the second page buffer unit 122.

The counter 160 selects page buffer circuits of the first page buffer unit 121 in which the data of the second page buffer unit 122 will be latched based on start column address information stored in the storage unit 161, and counts up to end column address, so that the data stored in the second page buffer unit 122 is latched in the first page buffer unit 121. Since the data line of the data transfer unit 141 has 32 bits, the counter 160 increases the address count every 4 units. This is because the data rate of 32 bits is four times faster than the data rate of 8 bits of data originally input from the IO pad 170.

Thus, the data rate is 4 times faster when the data latched in the second page buffer unit 122 is input to the first page buffer unit 121 through the data line of 32 bits than when program data is input from the IO pad 170 through the data line of 8 bits. Latching data in the second page buffer unit 122 is performed while data is programmed into the first plane 111, so a data input time is not increased.

After the plane cache data transfer section B is finished, the controller 150 changes the ready busy signal RB# to a high level and receives a plane cache data program command 85h and address information from the IO pad 170 at steps S215 and S217. A plane cache command 15h for the input of the third data group is also input at step S219. The address information includes the remaining row addresses of 3 cycles since the column address has already been input at step S209. Thus, the first plane 111 or the second plane 112 can be selected according to the row address of 3 cycles. As mentioned earlier, according to plane cache transmission, the same data has been latched in the first page buffer unit 121 and the second page buffer unit 122. A plane to be programmed can be freely selected using only the row address. If a row address has been input to the second plane 112, third data is latched in the first page buffer unit 121 while a program operation is performed on the second plane 112. The plane select unit 152 changes the plane select signal, which is then input to the demux 142.

In an embodiment of the present invention, it is assumed that all data is programmed into the first plane 111. Thus, the controller 150 selects the memory block BLK and the word lines WL of the first plane 111 according to a row address and outputs a control signal so that the second data group is programmed. A section where the second data group is programmed is a section C. During the section C, the internal ready busy signal Internal RB# shifts to a low level.

However, since the external ready busy signal RB# remains at a high level, the third data group is input from the IO pad 170 at step S223 and an execution command 10h is then input at step S225.

The demux 142 maintains a set state while performing the step S211, so that the third data group is transferred to the second page buffer unit 122. Further, a subsequent plane cache operation is performed subsequent to the operation of the previous sections B and section C.

The fourth data group is input. After the third data group is fully programmed in the flash memory device 100, the fourth data group is transferred from the second page buffer unit 122 to the first page buffer unit 121. A plane cache program command 85h is input at step S227 and address information of 3 cycles is input at step S229. An execution command 10h is input at step S231.

When the execution command 10h is input, the controller 150 shifts to a low level. Thus, if the program operation of the fourth data group is completed without further data input, all program operations are completed.

The program time when the plane cache program operation is performed can be calculated by the following Equation.

$$T=(K \times tWC+tPROG)+(K \times (1/4)tWC+tPROG) \times (N-1)$$ [Equation 3]

In the above Equation, '1/4' is used because, in an embodiment of the present invention, the rate of the data transfer line of the first page buffer unit 121 and the second page buffer unit 122 is four times faster than the data input rate from the IO pad 170.

According to the above operation, in the case of a flash memory device including a multi-plane, although an additional latch circuit for a cache program operation is not included in a page buffer circuit, a page buffer circuit of a plane that is not used can be used as a latch circuit for a cache program. Thus, the program speed can be increased.

As described above, according to the non-volatile memory device and the method of programming the same in accordance with the present invention, when a non-volatile memory device including a multi-plane performs a program operation, a page buffer of a plane that is not operated is used as a cache buffer. Accordingly, the program time can be shortened.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A non-volatile memory device, comprising:

two or more planes;

page buffer units respectively connected to the planes;

a data line mux configured to:
- transfer an externally input first data to a page buffer unit corresponding to a plane to be programmed, according to a plane select signal,
- transfer a second data to a page buffer unit corresponding to a plane on which a program operation is not performed, while the program of the selected plane is performed and after the first data is programmed,
- provide a data transfer path between one page buffer unit and the other page buffer unit according to a data transfer control signal; and a controller configured to:
- select a plane on which program operation will be performed based on externally input address information,
- store the second data in the page buffer unit corresponding to the unselected plane according to a plane cache write command, and
- provide a plane cache transmission signal and the data transfer control signal for transferring the stored second data to the page buffer unit of the selected plane on which the program is performed.

2. The non-volatile memory device of claim 1, wherein the controller comprises a counter configured to:
- count an address where the first data will be programmed based on the externally input address information, and
- store start and end column address information of the second data.

3. The non-volatile memory device of claim 1, wherein the data line mux comprises:
- a demux for providing a path through which externally input data is transferred to a page buffer unit of a plane selected according to the plane select signal of the controller; and
- a data transfer unit for providing the data transmission path between one page buffer unit and the other page buffer unit according to the data transfer control signal of the controller.

4. The non-volatile memory device of claim 3, wherein the demux selects one of the page buffer units according to the plane select signal and the plane cache transmission signal provided from the controller, and transmits the externally input data to a selected page buffer unit.

5. The non-volatile memory device of claim 4, wherein the demux transmits the first data to a page buffer unit of a plane selected in order to program the first data according to the plane select signal, and then transmits the second data to a page buffer unit of a plane on which program is not performed according to the plane select signal and the plane cache transmission signal.

6. The non-volatile memory device of claim 3, wherein the data transfer unit comprises one or more switching elements for providing, in one direction, the data transmission path between page buffer units according to the data transfer control signal of the controller.

7. The non-volatile memory device of claim 3, wherein when the page buffer units include a first page buffer unit and a second page buffer unit, the data transfer unit comprises:
- a first switching element for providing a data transfer path from the first page buffer unit to the second page buffer unit; and
- a second switching element for providing a data transfer path from the second page buffer unit to the first page buffer unit,
- wherein the first and second switching elements operate in response to the data transfer control signal.

8. The non-volatile memory device of claim 1, wherein the controller comprises:
- a cache transmission controller for outputting the data transfer control signal by employing plane address information and the plane cache transmission signal, wherein the plane address information is included in the input address; and
- a plane select unit for outputting the plane select signal according to the plane address information and the plane cache write command.

9. The non-volatile memory device of claim 8, wherein when the plane write command is input, the plane select unit generates the plane select signal so that a plane on which a program operation has not been performed is selected.

10. A non-volatile memory device comprising:

$N^{th}$ planes;

$N^{th}$ page buffer units respectively connected to the N planes;

a data line mux configured to
- transfer an externally input first data to a first page buffer unit of a first plane to be programmed according to a plane select signal,
- transfer a second data to a second page buffer unit of a second plane on which a program operation is not performed while a program of the first plane is performed, and
- after the program of the first data is completed, provide a data transfer path for transferring the second data stored in the second page buffer unit to any one of the first, a third or a $N^{th}$ page buffer unit according to a data transfer control signal; and and a controller configured to
- select the first plane using externally input address information,
- store the second data in a page buffer unit of the second plane according to a plane cache write command, and
- provide a plane cache transmission signal and the data transfer control signal for transferring the stored second data to a page buffer unit connected with any one of the first, third or the $N^{th}$ plane selected to be programmed.

* * * * *